United States Patent [19]

Fujimoto et al.

[11] Patent Number: 4,985,113

[45] Date of Patent: Jan. 15, 1991

[54] SAMPLE TREATING METHOD AND APPARATUS

[75] Inventors: Kotaro Fujimoto; Yoshie Tanaka; Hironobu Kawahara; Yoshiaki Sato, all of Kudamatsu, Japan

[73] Assignee: Hitachi, Ltd., Tokyo, Japan

[21] Appl. No.: 489,550

[22] Filed: Mar. 7, 1990

[30] Foreign Application Priority Data

Mar. 10, 1989 [JP] Japan .................................. 1-56473

[51] Int. Cl.$^5$ ............................ C23F 1/02; B44C 1/22; C03C 15/00; C03C 25/06
[52] U.S. Cl. ...................................... 156/643; 134/1; 156/646; 156/651; 156/656; 156/659.1; 156/665; 156/345; 204/192.35; 204/298.31; 427/38; 252/79.1
[58] Field of Search ............... 156/643, 646, 651, 656, 156/659.1, 665, 345; 252/79.1; 204/192.32, 192.35, 298; 134/1, 31; 427/38, 39, 309; 118/728, 50.1, 620

[56] References Cited

U.S. PATENT DOCUMENTS

| 4,372,807 | 2/1983 | Vossen et al. ........................ 156/643 |
| 4,547,260 | 10/1985 | Takada et al. .................. 156/665 X |
| 4,563,240 | 1/1986 | Shibata et al. ..................... 156/643 |
| 4,795,529 | 1/1989 | Kawasaki ......................... 156/646 X |

*Primary Examiner*—William A. Powell
*Attorney, Agent, or Firm*—Antonelli, Terry, Stout & Kraus

[57] ABSTRACT

A sample treating method and apparatus adapted to treat a sample such as a semiconductor element substrate or the like and, particularly, a sample that must be etched and anticorrosion-treated. The adhered matters formed by the etching of the sample are removed from the sample sufficiently and easily when the etched sample is treated by utilizing the plasma of an anticorrosion gas that is capable of removing the adhered matters. There is required no wet-type anticorrosion treatment enabling the throughput to be improved in treating the samples that must be etched and anticorrosion-treated.

20 Claims, 2 Drawing Sheets

SAMPLE TREATING METHOD AND APPARATUS

BACKGROUND OF THE INVENTION

1. Field of the Invention

The present invention relates to a sample treating method and an apparatus, and more particularly to a method and an apparatus for treating samples such as semiconductor element substrates that are to be etched as well as to be anticorrosion-treated.

2. Description of the Prior Art

In etching samples such as semiconductor element substrates having, for example, an aluminum film, an aluminum alloy film, or a multi-film structure consisting of these films and a barrier metal using a plasma of a halogen gas, a problem arises in regard to corrosion when they are exposed to the atmosphere after etching. Therefore, these samples must be anticorrosion-treated in addition to being etched. In order to cope with such requirements, there have heretofore been proposed the following technologies.

Japanese Patent Publication No. 30268/1987 discloses a technology of dry-etching and after-treatment according to which an aluminum film or an aluminum alloy film such as of aluminum-silicon, aluminum-copper, or aluminum-silicon-copper is dry-etched in a vessel using a halogen compound gas which is active, followed by treatment with a plasma of a mixture gas consisting of fluorocarbon and oxygen without taking it out of the vessel.

Further, Japanese Patent Publication No. 12343/1983 discloses a technology which exposes the etched aluminum film or the aluminum alloy film to the fluorination plasma in order to prevent the film etched by using the chlorination plasma from corroding after etching.

According to such technologies, however, it is difficult to remove corrosive matter formed during the etching of the samples and adhesive to the side walls of the patterns. In such prior technologies, furthermore, the substitution reaction (substitution into $Al_2O_3$ due to the reaction of, for example, $AlCl_3$ which is a component of the adherred corrosive matter with, for example, oxygen which is a component of gas plasma in the after-treatment) takes place on the surface layer only of the corrosive matter adhered to the side walls of the pattern, and does not proceed into the adhered corrosive matter. When the samples are exposed to the atmosphere, furthermore, water content in the open air infiltrates into the corrosive adhered matter which is not dense, whereby the reaction takes place between the infiltrated water content and the corrosive adhered matter to form a corrosive component (e.g., hydrochloric acid) that corrodes the samples. According to the conventional technologies, as described above, the samples after etching do not have sufficient resistance against the corrosion. In dealing with modern multi-layer films consisting of aluminum and other materials or aluminum alloy films containing copper, in particular, corrosion develops due to the so-called cell action (aluminum works as an anode), the degree of corrosion is accelerated, and lack of resistance against the corrosion becomes more conspicuous.

Therefore, these samples have generally been anticorrosion-treated by a wet system after etching as disclosed in, for example, Japanese Patent Laid-Open No. 133388/1986. The wet-type anticorrosion treatment makes it possible to remove corrosive matters adhered to the side walls of the pattern of the samples and to increase resistance of the samples against corrosion in the open air after etching.

According to the above-mentioned prior art which anticorrosion-treat the samples based on the wet system after etching, any water content remaining after the wet-type anticorrosion treatment reacts with a component containing, for example, chlorine that remains after the wet-type anticorrosion treatment or reacts with chlorine in the open air to form hydrochloric acid (HCl) which is a corrosive component. Therefore, the samples are corroded after the wet-type anticorrosion treatment. Inevitably, therefore, drying is required after the wet anticorrosion treatment.

Therefore, the conventional are involves the following problems.

(1) An extended period of time (at least wet-type anticorrosion treatment time plus dry treatment time) is required before the anticorrosion treatment of samples is finished after etching, and the throughput decreases.

(2) The cost of the apparatus increases and an increased area is occupied by the apparatus when the samples after etching are anticorrosion-treated using a wet-type anticorrosion treatment apparatus and another dry-treatment apparatus (needing means for conveying the samples between these apparatus as a matter of course).

(3) Apparatus are needed to recover waste liquor from the wet-type anticorrosion treatment and to treat the waste liquor, causing the apparatus to become complex and increasing the cost.

SUMMARY OF THE INVENTION

The object of the present invention is to provide a sample treating method which effects while maintaining an increased throughput in treating the samples that require anticorrosion treatment, and to provide an apparatus therefor.

The above object is achieved by at least a sample treating method comprising a step for forming a plasma of etching gas, a step for etching the sample by utilizing the plasma of the etching gas, a step for forming a plasma of an anticorrosion gas that is capable of removing from the sample the adhered matters formed by the etching of the sample, and a step for anticorrosion-treating the etched sample by utilizing the plasma of said anticorrosion gas. The object also is achieved by at least a sample treating apparatus comprising means for forming a plasma of an etching gas, means for forming a plasma of an anticorrosion gas that is capable of removing the adhered matters formed by the etching of the sample using the plasma of the etching gas, and means for holding the sample that is treated by utilizing the plasma of the etching gas and the plasma of the anticorrosion gas.

DESCRIPTION OF THE PREFERRED EMBODIMENTS

The interior of the treating chamber is evacuated by evacuation means. The samples are held by sample holding means in the treating chamber. An etching gas is introduced into the treating chamber by gas introducing means. An etching gas in the treating chamber is formed into a plasma by plasma generation means. The sample held by sample holding means is etched with the plasma. An anticorrosion gas is also introduced into the treating chamber by gas introducing means. The anticorrosion gas in the treating chamber is formed into a plasma by plasma generation means. The sample held by sample holding means is treated by utilizing the plasma.

The anticorrosion treatment of the samples that is carried out by utilizing the plasma of the anticorrosion gas easily removes reaction products that are formed by the etching of the samples and that adhere to the samples, as well as etching gas components that are corrosive in the open air (hereinafter referred to as adhered matters), without forming any new adhered matter.

Therefore, no wet-type anticorrosion treatment is necessary making it possible to greatly reduce the time required before the anticorrosion treatment of the sample is finished.

An embodiment of the present invention will now be described in conjunction with FIGS. 1 to 5.

Figure 1:
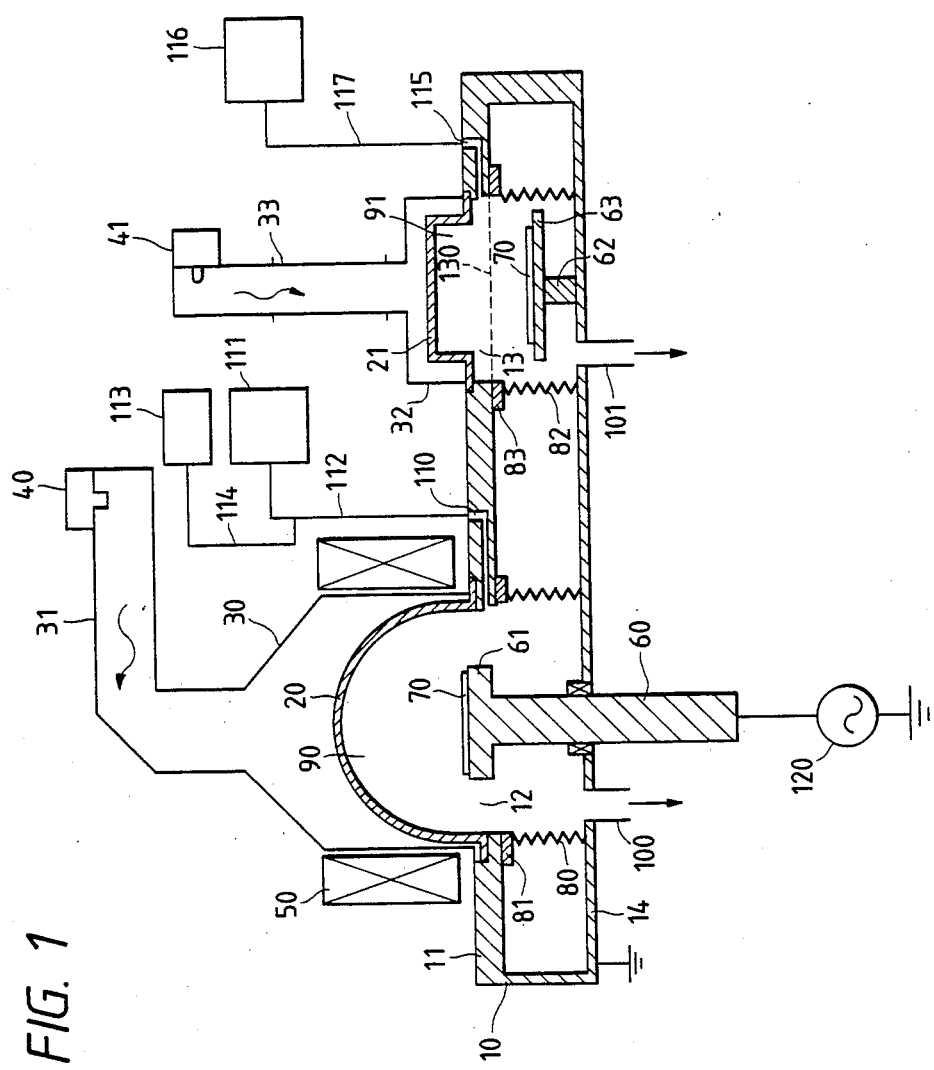
FIG. 1 is a diagram illustrating the constitution of a plasma-etching apparatus according to an embodiment of the present invention.

In FIG. 1, two openings 12 and 13 are formed maintaining a predetermined distance and a diameter in a top wall of a buffer chamber 10. Means (not shown) for evacuating the interior of the buffer chamber 10 is provided in the buffer chamber 10. A discharge tube 20 is air-tightly provided on the top wall 11 of the buffer chamber 10 corresponded to the opening 12. The discharge tube 20 in this case has nearly a hemispherical shape. A waveguide 30 is arranged on the outside of the discharge tube 20 so as to include the discharge tube 20 therein. The axis of the waveguide 30 is in agreement with that of the discharge tube 20. The waveguide 30 and a magnetron 40, that is, means for generating microwaves, are coupled together via another waveguide 31. Magnetic field generating means such as a solenoid coil 50 surrounds the waveguide 30 and nearly corresponds to the discharge tube 20. The solenoid coil 50 is electrically connected to a power source (not shown) via current adjusting means (not shown). A sample table shaft 60 has its upper portion protruded into the buffer chamber 10 and into the discharge tube 20 and has its lower portion protruded beyond the buffer chamber 10 so as to be airtightly inserted in a bottom wall 14 of the buffer chamber 10. A sample table 61 is provided nearly horizontally at the upper end of the sample table shaft 60. The sample table 61 has the shape of a plane which is smaller than the opening 12 but is greater than a sample 70. The sample table 61 has a plane for placing the sample on the front surface thereof, i.e., on the surface corresponding to the top of the discharge tube 20. The axes of the sample table shaft 60 and of the sample table 61 are nearly in agreement with the axis of the discharge tube 20. A metallic bellows 80 is provided in the buffer chamber 10 to surround the sample table shaft 60. The lower end of the bellows 80 is provided inside the bottom wall 14 of the buffer chamber 10. A flange 81 is attached to the upper end of the bellows 80. A sealing ring (not shown) is provided on the surface of the flange 81 that is opposed to the inner surface of the top wall 11 of the buffer chamber 10. Means (not shown) is also provided to expand and contract the bellows 80. Space 90 is defined being airtightly shut off from the interior of the buffer chamber 10 under the condition where the bellows 80 is expanded by expansion-contraction drive means and the flange 81 is pressed via the sealing ring onto the inner surface of top wall 11 of the buffer chamber 10. An evacuation nozzle 100 is formed in the bottom wall 14 of the buffer chamber 10 to be communicated with the space 90. An evacuation pipe (not shown) coupled to an evacuation device (not shown) is coupled to the evacuation nozzle 100. The evacuation pipe is provided with a switching valve and an evacuation resistance variable valve (not shown). A gas introduction path 110 is formed in the top wall 11 of the buffer chamber 10 so as to be communicated with the space 90. A gas introduction pipe 112 coupled to a source 111 of etching gas is connected to the gas introduction path 110. The gas introduction pipe 112 is provided with the switching valve and a gas flow rate control device (not shown). Further, a gas introduction pipe 114 coupled to a source 113 of anticorrosion gas is coupled to the gas introduction pipe 112 on the downstream side of the switching valve and the gas flow rate control device that are provided for the gas introduction pipe 112. The gas introduction pipe 114 is provided with the switching valve and the gas flow rate control device (not shown). The gas introduction pipe 114 may be directly coupled to the gas introduction path 110. There is provided a power source for applying a bias such as a high-frequency power source 120. The sample table 61 is electrically connected to the high-frequency power source 120 via the sample table shaft 60. Further, the buffer chamber 10 and the high-frequency power source 120 are grounded, respectively. The sample 70 can be controlled to a predetermined temperature via the sample table 61.

In FIG. 1, the discharge tube 21 is airtightly provided on the top wall 1 of the buffer chamber 10 corresponding to the opening 13. The discharge tube 21 has nearly a cylindrical shape, one end thereof being nearly flat and closed and the other end thereof being open. A waveguide 32 is arranged on the outside of the discharge tube 21 to include the discharge tube 21 therein. The axis of the waveguide 32 is nearly in agreement with that of the discharge tube 21. A sample table shaft 62 is provided on the bottom wall 14 of the buffer chamber 10. A sample table 63 is provided nearly horizontally at the upper end of the sample table shaft 62. The sample table 63 has the shape of a plane which is smaller than the opening 13 but is greater than the sample 70. The sample table 63 has a plane for placing the sample on the front surface thereof, i.e., on the surface opposed to the closed end of the discharge tube 21. The axes of the sample table shaft 62 and the sample table 63 are nearly in agreement with the axis of the discharge tube 21. A metallic bellows 82 is provided to surround the sample table shaft 62 in the buffer chamber 10. The lower end of the bellows 82 is provided inside the bottom wall 14 of the buffer chamber 10. A flange 83 is provided at the upper end of the bellows 82. A sealing ring (not shown) is provided on the surface of the flange 83 opposed to the inner surface of top wall 11 of the buffer chamber 10. There is further provided means (not shown) for expanding and contracting the bellows 82. Space 91 is defined being airtightly shut off from the interior of the buffer chamber 10 under the condition where the bellows 82 is expanded by expansion-contraction drive means and the flange 83 is pressed via the sealing ring onto the inner surface of top wall 11 of the buffer chamber 10. An evacuation nozzle 101 is formed in the bottom wall 14 of the buffer chamber 10 to be communicated with the space 91. An evacuation pipe (not shown) coupled to an evacuation device (not shown) is coupled to the evacuation nozzle 101. The evacuation pipe is provided with a switching valve and an evacuation resistance variable valve (not shown). A gas introduction path 115 is formed in the top wall 11 of the buffer chamber 10 so as to be communicated with the space 91. A gas introduction pipe 117 coupled to a source 116 of gas for after-treatment is coupled to the gas introduction path 115. The gas introduction pipe 117 is provided with a switching valve and a gas flow rate control device (not shown). In FIG. 1, reference numeral 130 denotes a reflection end.

In FIG. 1, furthermore, provision is made of means for conveying the sample 70 into the buffer chamber 10 to hand it over onto the sample-placing surface of the sample table 61, means for conveying the sample 70 from the sample table 61 to the sample table 63 through the buffer chamber 10, and means (none of these means are shown) which receives the sample 70 from the sample table 63 and carries it out of the buffer chamber 10.

In FIG. 1, the bellows 80 and 82 are contracted by their respective expansion-contraction drive means. Under this condition, the evacuation means is operated so that the interiors of the buffer chamber 10 and the discharge tubes 20, 21 are evacuated into a predetermined pressure. Thereafter, the sample 70, one sample in this case, is conveyed into the buffer chamber 10 and is placed with its surface to be treated being faced upwards on the sample-placing surface of the sample table 61. Thereafter, the space 90 is formed. The predetermined etching gas is introduced at a predetermined rate from the source 111 of etching gas into the space 90. In this case, no anticorrosion gas is introduced from the source 113 of anticorrosion gas into the space 90. The etching gas in space 90 is partly evacuated via the evacuation nozzle 100 such that the pressure in space 90 is adjusted to a predetermined value for effecting the etching. Furthermore, a microwave electric field is generated by the magnetron 40 and a magnetic field is generated by the solenoid coil 50. The etching gas in the discharge tube 20 in space 90 is formed into a plasma due to the synergistic action of the microwave electric field and the magnetic field. The surface to be treated of the sample 70 placed on the sample-placing surface of the sample table 61 is etched with the plasma. During etching, a high-frequency bias is applied to the sample 70 whose temperature is controlled to a predetermined value via the sample table 61. When the etching is finished, introducing of the etching gas is stopped, and operations of the magnetron 40, solenoid coil 50, and high-frequency power source 120 are stopped too.

Thereafter, the space 90 is evacuated again to a predetermined pressure. Further, the switching value provided for the gas conduit 114 is opened. That is, the predetermined anticorrosion gas is introduced at a predetermined flow rate from the source 113 of anticorrosion gas into the space 90 that is evacuated to a predetermined pressure instead of the etching gas. The anticorrosion gas in space 90 is partly evacuated through the evacuation nozzle 100 such that the pressure in space 90 is adjusted to a predetermined value for anticorrosion treatment. On the other hand, the microwave electric field is generated by the magnetron 40 and the magnetic field is generated by the solenoid coil 50. The anticorrosion gas in the discharge tube 20 in space 90 is formed into a plasma due to the synergistic action of the microwave electric field and the magnetic field. The etched sample 70 placed on the sample-placing surface of the sample table 61 is anticorrosion-treated by utilizing the plasma. That is, the matter formed by the etching with plasma and adhered to the sample 70 is removed from the sample 70. During the anticorrosion treatment, a high-frequency bias is applied to the sample 70 that is etched, and the temperature of the etched sample 70 is controlled to a predetermined value via the sample table 61. At a moment when the anticorrosion treatment is finished, introduction of the anticorrosion gas is stopped, and operations of the magnetron 40, solenoid coil 50 and high-frequency power source 120 are stopped too. Thereafter, the bellows 80 is contracted.

Then, under this condition, the sample 70 that is anticorrosion-treated is conveyed from the sample table 61 to the sample table 63 through the buffer chamber 10 and is placed on the sample-placing surface of the sample table 63 with its surface to be treated being faced upwards. Then, the space 91 is formed. A predetermined gas for after-treatment such as a gas for resist ashing and a gas for passivation is introduced at a predetermined flow rate from the source 116 of after-treatment gas into the space 91. The gas for after-treatment in space 91 is partly evacuated through the evacuation nozzle 101 such that the pressure in space 91 is adjusted to a predetermined value for after-treatment. A microwave electric field is generated by the magnetron 41, and the gas for after-treatment in the discharge tube 21 in space 91 is formed into a plasma by the action of the microwave electric field. The sample 70 placed on the sample-placing surface of the sample table 63 is subjected to the after-treatment such as the resist ashing or the passivation utilizing the plasma. At a moment when the after-treatment is finished, introduction of the gas for after-treatment is stopped and the operation of the magnetron 41 is stopped too. Then, the bellows 82 is contracted. Under this condition, the sample 70 that is treated is removed from the sample table 63 and is taken out of the buffer chamber 10.

The aforementioned treatment operations are successively carried out, and the sample is treated one by one continuously.

Figure 2:
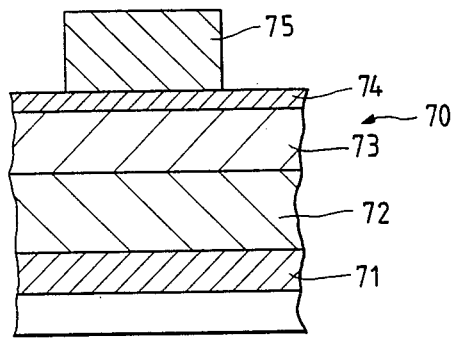
FIG. 2 is a vertical section view illustrating principal portions of a sample treated by the plasma-etching apparatus of FIG. 1.

The sample 70 may, for example, be the one that is shown in FIG. 2. That is, the sample 70 in FIG. 2 has a laminated-layer structure which consists of a TiN film 72 which is a barrier metal formed on a silicon oxide film 71 which is an underlying oxide film, an Al-Cu-Si alloy film 73 formed thereon, and a cap metal 72 formed further thereon. A resist 75 is formed on the cap metal 74. Here, the barrier metal is used for preventing the precipitation of silicon on the contact portions where the silicon oxide film 71 and the Al-Cu-Si alloy film 73 are electrically connected together and for preventing the wiring from being broken by electromigration or the stress migration. In addition to the TiN film 71, the barrier metal may be a high-melting metal film of the type of, for example, TiW, TiW/Ti, TiN/Ti, $MoSi_2$, $WSi_2$, or W, or an alloy film thereof. Like the barrier metal, the cap metal 74 works to prevent the wiring from being broken by electromigration or stress migration and further works to prevent halation when the resist film is exposed to the beam. As the cap metal 74, there is used a film composed of TiN, MoSi$_2$, TiW, polysilicon, WSi$_2$ or the like.

In this case, the gas for etching consists of a halogen gas containing, for example, chlorine, such as a BCL$_3$+CL$_2$ mixture gas. In FIG. 1, the BCl$_3$+Cl$_2$ mixture gas in the discharge tube in space 90 is formed into a plasma by the synergistic action of the microwave electric field and the magnetic field. The sample 70 shown in FIG. 2 is etched by utilizing the plasma. The conditions for etching in this case are as follows:

| Flow rate of etching gas that is introduced | BCl$_3$: 40 cc/min. Cl$_2$: 60 cc/min. |
|---|---|
| Pressure for etching | 10 mTorr |
| Microwave power | 700 W |
| Magnetic filed intensity | 875 Gausses |
| High-frequency bias power | 70 W |
| Temperature of sample 70 | 40° C. |

Figure 3:
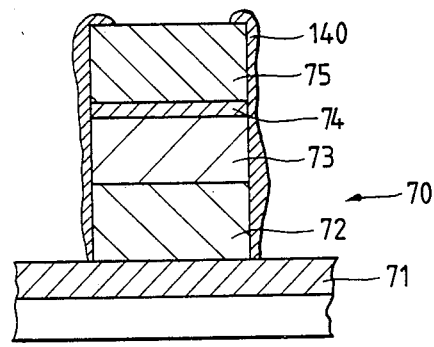
FIG. 3 is a vertical section view illustrating principal portions of the sample of FIG. 2 after etching.

FIG. 3 is a vertical section view of the sample 70 that is etched under the above-mentioned conditions. As shown in FIG. 3, matters (reaction products and chlorides of etching gas components) 140 adhere to the side walls and to the surface of the resist 75. The sample 70 thus etched is anticorrosion-treated with the plasma using a chlorine gas (Cl$_2$) as an anticorrosion gas. That is, in FIG. 1, Cl$_2$ in the discharge tube 20 in space 90 is formed into a plasma by the synergistic action of the microwave electric field and the magnetic field. The etched sample 70 shown in FIG. 3 is anticorrosion-treated by utilizing the plasma. In this case, the anticorrosion treatment conditions are as follows:

| Flow rate of anticorrosion gas that is introduced | Cl$_2$: 90 cc/min. |
|---|---|
| Pressure for anticorrosion treatment | 10 mTorr |
| Microwave power | 700 W |
| Magnetic field intensity | 875 Gausses |
| High-frequency bias power | 40 W |
| Discharge (anticorrosion treatment) time | 20 sec. |
| Temperature of sample 70 | 40° C. |

The matter 140 containing chlorine adhered to the etched sample 70 are removed from the etched sample 70 as the matter 140 reacts with chlorine ions and chlorine radical in the plasma of Cl$_2$ gas. No new matter adheres to the etched sample 70 in the anticorrosion treatment. When the discharge (anticorrosion treatment) time is shorter than 20 seconds, the matter is not sufficiently removed from the etched sample 70. Therefore, the discharge (anticorrosion treatment)time should be about 20 seconds at the shortest. When the discharge (anticorrosion treatment) time is too long, however, the wiring film itself is etched and the wiring becomes thinner than a predetermined pattern. The thus anticorrosion-treated angle 70 is subjected to after-treatment and is then taken out of the buffer chamber 10. In the after-treatment, in this case, the resist ashing and the passivation are effected simultaneously. That is, an oxygen gas or a gas containing oxygen is used as a gas for the after-treatment, the resist 75 is removed from the anticorrosion-treated sample 70 by utilizing the plasma of the gas for after-treatment and, at the same time, a passivation film is formed on the pattern surface. The sample 70 is then left to stand in the open air. Even when it is left to stand for 48 hours, there is observed no corrosion of the sample 70. By effecting the passivation treatment in addition to the anticorrosion treatment, the above effect is further promoted due to the function of the passivation film that is formed on the pattern surface.

The same results are also obtained even when use is made, as an anticorrosion gas, of an inert gas such as helium, argon, or a mixture gas consisting of the chlorine gas and the inert gas. When, for example, an inert gas is used as anticorrosion gas, only the sputtering action takes place without participating in the chemical reaction and without forming any matter that adheres. Therefore, the same results are obtained as those of when the chlorine gas is used as the anticorrosion gas. When the anticorrosion treatment is carried out under the following conditions by using argon as as the anticorrosion gas, there are obtained the same effects as those of when the chlorine gas is obtained.

| Flow rate of anticorrosion gas that is introduced | Ar: 50 cc/min. |
|---|---|
| Pressure for anticorrosion treatment | 6 mTorr |
| Microwave power | 700 W |
| Magnetic field intensity | 875 Gausses |
| High-frequency bias power | 50 W |
| Discharge (anticorrosion treatment) time | 60 sec. |
| Temperature of sample 70 | 40° C. |

When the discharge (anticorrosion treatment) time is shorter than 60 seconds, the adhered matter 140 is not sufficiently removed from the etched sample 70. Therefore, the discharge (anticorrosion treatment) time should be about 60 seconds at the shortest. Even when the discharge (anticorrosion treatment) time is longer than 60 seconds, the aforementioned inconvenience develops little unlike the case of when the chlorine gas is used as the anticorrosion gas.

The same results are obtained even when use is made, as the anticorrosion gas, of a mixture gas containing at least 90% of chlorine gas (the remainder being the one other than the inert gas). Examples of the remainder gas other than the inert gas to be added to the chlorine gas include those gases that do not deposit such as SF$_6$, Br$_2$ and the like. Here, for instance, the sample has a laminated-layer structure which comprises a TiW film that is a barrier metal on a silicon oxide film that is the underlying oxide film, and an Al-Cu alloy film with a resist being formed on the Al-Cu alloy film. When the sample etched under the same etching conditions as those for the sample 70 is anticorrosion-treated using a Cl$_2$+SF$_6$ mixture gas is the anticorrosion gas, there are obtained the same effects as those mentioned above. In this case, the flow rates for introducing the anticorrosion gases are 90 cc/min. for Cl$_2$ and 5 cc/min. for SF$_6$, and other anticorrosion treatment conditions are the same as those of when the chlorine gas is used as the anticorrosion gas.

The aforementioned embodiments are particularly preferred when the sample includes aluminum and, particularly, an aluminum film, an aluminum alloy film (e.g., aluminum alloy film containing 0.5 to 5% of copper), or when the sample has the laminated-layer structure consisting of these films and a barrier metal.

In addition to the above-mentioned embodiments, furthermore, there may be used ozone to subject the anticorrosion-treated sample 70 to the passivation treatment. In this case, plasma generation used in the above embodiment is not necessary but, instead, there must be used means for generating ozone and means for introducing ozone used by the above means into the space 91. Moreover, if ozone is irradiated with ultraviolet rays (UV), the passivation film formed on the pattern surface becomes more dense and solid presenting desirable properties from the standpoint of avoiding corrosion.

The aforementioned embodiments offer the following effects.

(1) No wet-type anticorrosion treatment is necessary, making it possible to greatly reduce the time required for anticorrosion-treating the sample and to increase the throughput.

(2) The wet-type anticorrosion treatment technology requires the wet-type anticorrosion treatment apparatus and a drying apparatus. The embodiment of the invention, however, requires no drying apparatus making it possible to decrease the cost of the apparatus and to decrease the area occupied by the apparatus.

(3) There is no need of recovering the waste liquor or treating the waste liquor, and the apparatus is simply constructed at a reduced cost.

(4) The etching treatment and the anticorrosion treatment are carried out in the same chamber, and the sample need not be conveyed from the etching treatment unit to the anticorrosion treatment unit. Therefore, the time required for anticorrosion-treating the sample is further shortened contributing to further enhancing the throughput.

(5) The etching treatment and the anticorrosion treatment are carried out in the same chamber, making it possible to decrease the cost of the apparatus and to decrease the area occupied by the apparatus.

(6) The sample can be overetched by utilizing the plasma of an anticorrosion gas. In this case, the etching gas and the anticorrosion gas can be switched by time control or by an etching completion discrimination signal from an etching completion detect means (not shown).

(7) The sample can be anticorrosion-treated by utilizing the plasma of an anticorrosion gas while the sample is being etched utilizing the plasma of an etching gas containing the anticorrosion gas. When the sample is being etched, in this case, the etching gas and the anticorrosion gas can be introduced by being switched alternatingly.

The above-mentioned treatment can be put into practice by using an apparatus having separate spaces (i.e., having two treating chambers) for the etching treatment and the anticorrosion treatment instead of the aforementioned embodiments.

In the above embodiments, the sample is etched with the plasma generated by the microwave electric discharge in the presence of a magnetic field and is then anticorrosion-treated utilizing the plasma generated by the microwave electric discharge in the presence of a magnetic field. However, there is no particular limitation with regard to what sort of electric discharge is used to generate the plasma. For instance, the sample after being etched with plasma may be anticorrosion-treated by utilizing plasma that is generated by a dc electric discharge, ac electric discharge (high-frequency electric discharge), or high-frequency discharge in the presence of a magnetic field such as magnetron discharge. Furthermore, the anticorrosion treatment may be effected by utilizing the plasma generated by the microwave electric discharge in the absence of magnetic field. In this case, it is desired to apply a bias to the sample that is anticorrosion-treated.

Furthermore, the plasma of the anticorrosion gas may be need not be formed based on the electric discharge but using any other form of energy such as light energy (photo-excitation).

In the aforementioned embodiments, furthermore, the etching gas and the anticorrosion gas are formed into plasma in the treating chamber. It is, however, also allowable to generate the plasma the etching gas and the anticorrosion gas outside the treating chamber and to convey (transit) the plasma into the treating chamber. In this case, the sample after being etched with plasma is anticorrosion-treated by utilizing the plasma of anticorrosion gas that is formed outside the treating chamber and that is conveyed (transited) into the treating chamber. Furthermore, the sample is etched with the plasma of an etching gas that is generated outside the treating chamber and is conveyed (transited) into the treating chamber, and the etched samples is anticorrosion-treated by utilizing the plasma of anticorrosion gas that is generated outside the treating chamber and is conveyed (transited) into the treating chamber.

According to the present invention, there can be used samples of the laminated-layer structure consisting of metal films such as of aluminum, silicon, copper, tungsten, titanium, molybdenum and the like, or alloy films thereof, or alloy films of these metals and silicon, or these films and high-melting metals such as tungsten and molybdenum, and silicide films thereof or TiN and TiW films.

According to the present invention as described above, the wet-type anticorrosion treatment is not required enabling the throughout to be increased in treating the samples that must be etched and anticorrosion-treated.

What is claimed is:

1. A sample treating method comprising:
   a step for generating a plasma of an etching said step for etching a sample by utilizing said plasma of said etching gas;
   a step for generating a plasma of an anticorrosion gas that is capable of removing from said sample adhered matters formed by said step for etching of said sample; and
   a step for anticorrosion-treating said etched sample by utilizing said plasma of said anticorrosion gas.

2. A sample treating method according to claim 1, wherein said sample includes an aluminum film, and aluminum alloy film, or films of a multi-layer structure consisting of these films and a barrier metal, said etching gas comprises a halogen gas, and said adhered matters contain halogen formed by said step for etching of said sample and are removed from said sample by said step for anticorrosion-treating.

3. A sample treating method according to claim 2, wherein said sample includes an aluminum film, an aluminum alloy film, or films of a multi-layer structure consisting of these films and a barrier metal, said etching gas contains chlorine, and said adhered matters contain chlorine formed by said step for etching of said sample and are removed from said sample by said step for anticorrosion-treating, wherein said anticorrosion gas comprises a chlorine gas.

4. A sample treating method according to claim 2, wherein said sample includes an aluminum film, and aluminum alloy film, or films of a multi-layer structure consisting of these films and a barrier metal, said etching gas contains chlorine, and said adhered matters contain chlorine formed by said step for etching of said sample and are removed from said sample by said step for anticorrosion-treating, wherein said anticorrosion gas comprises an inert gas.

5. A sample treating method according to claim 2, wherein said sample includes an aluminum film, an aluminum alloy film, or films of a multi-layer structure consisting of these films and a barrier metal, said etching gas contains chlorine, and said adhered matters contain chlorine formed by said step for and are removed from said sample said step for anticorrosion-treating, wherein said anticorrosion gas comprises a mixture gas which consists of a chlorine gas and a gas other than the inert gas and having no depositing property, said chlorine gas being contained in an amount of at least 90%.

6. A sample treating method according to claim 1, wherein said plasma of said anticorrosion gas is generated by the synergistic action of a microwave electric field and a magnetic field, and a bias is applied to said sample during said step for anticorrosion-treating.

7. A sample treating method according to claim 1, wherein said step for etching and said step for anticorrosion-treating are carried out in the same treating space.

8. A sample treating method comprising:
a step for etching a sample having an aluminum film, an aluminum alloy film, or films of a multi-layer structure consisting of these films and a barrier metal by utilizing the plasma of a halogen gas;
a step for anticorrosion-treating said etched sample by utilizing the plasma of an anticorrosion gas that is capable of removing matters that contain halogen formed by said step for etching of said sample, and
a step for subjecting the anticorrosion-treated sample to a passivation treatment.

9. A sample treating method according to claim 8, wherein said anticorrosion-treated sample is subjected to passivation treatment by utilizing a plasma of an oxygen gas or a gas that contains oxygen.

10. A sample treating method according to claim 8, wherein said anticorrosion-treated sample is subjected to said passivation treatment by using ozone.

11. A sample treating apparatus comprising:
means for generating a plasma of an etching gas;
means for generating a plasma of an anticorrosion gas that is capable of removing adhered matters formed by the etching of a sample using the plasma of said etching gas; and
means for holding the sample that is treated with the plasma of said etching gas and with the plasma of said anticorrosion gas.

12. A sample treating apparatus according to claim 11, wherein said means for generating the plasma of the etching gas is the one that generates the plasma of the etching gas and is introduced into an evacuated treating chamber based on the synergistic action of a microwave electric field and a magnetic field, said means for generating the plasma the anticorrosion gas is one that generates the plasma of the anticorrosion gas and is introduced into an evacuation treating chamber based on the synergistic actin of a microwave electric field and a magnetic field, and said means for holding the sample that is treated utilizing the plasma of said anticorrosion gas is the one that is biased.

13. A sample treating apparatus according to claim 12, wherein a high-frequency power source is connected to said means for holding the sample that is treated by utilizing the plasma of said anticorrosion gas.

14. A sample treating apparatus according to claim 12, wherein said treating chamber into which are introduced said etching gas and said anticorrosion gas is the same treating chamber.

15. A sample treating apparatus according to claim 14, further comprising means for alternately introducing the etching gas and the anticorrosion gas into said treating change.

16. A sample treating apparatus according to claim 12, wherein said treating chamber into which said etching gas is introduced is different from said treating chamber into which said anticorrosion gas is introduced.

17. A sample treating apparatus comprising:
means for generating a plasma of an etching gas;
a treating chamber in which a sample is etched by utilizing the plasma of said etching gas;
means for generating a plasma of an anticorrosion gas which is capable of removing adhered matters formed by etching of said sample;
a treating chamber in which an etched sample is anticorrosion-treated by utilizing the plasma of said anticorrosion gas; and
a treating chamber in which an anticorrosion-treated sample is subjected to passivation treatment.

18. A sample treating apparatus according to claim 17, wherein the treating chamber for the passivation treatment is the one in which said anticorrosion-treated sample is treated by utilizing a plasma of an oxygen gas or a gas containing oxygen.

19. A sample treating apparatus according to claim 17, wherein the treating chamber for the passivation treatment is the one in which said anticorrosion-treated sample is treated by using ozone.

20. A sample treating method according to claim 1, wherein said step for etching and said step for anticorrosion-treating are carried out in different treating spaces.

* * * * *

UNITED STATES PATENT AND TRADEMARK OFFICE
CERTIFICATE OF CORRECTION

PATENT NO.   :   4,985,113
DATED        :   January 15, 1991
INVENTOR(S)  :   FUJIMOTO et al It is certified that error appears in the above-identified patent and that said Letters Patent is hereby corrected as shown below:

Claim 1, column 10, line 39, delete "said" and insert --gas;
   a --.

Signed and Sealed this

Tenth Day of February, 1998

Attest:

BRUCE LEHMAN

Attesting Officer

Commissioner of Patents and Trademarks